(12) United States Patent
Gordon et al.

(10) Patent No.: US 6,863,169 B2
(45) Date of Patent: Mar. 8, 2005

(54) PRINTED CIRCUIT BOARD SUPPORT

(75) Inventors: Brian F. Gordon, Boise, ID (US); Tony M. Teitenberg, Meridian, ID (US); John S. Godfrey, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 10/375,456

(22) Filed: Feb. 27, 2003

(65) Prior Publication Data

US 2003/0127305 A1 Jul. 10, 2003

Related U.S. Application Data

(62) Division of application No. 09/704,294, filed on Nov. 1, 2000, now Pat. No. 6,631,798.

(51) Int. Cl.⁷ .............................................. B65G 15/64
(52) U.S. Cl. .................. 198/345.2; 29/760; 269/289 R; 269/71; 269/8
(58) Field of Search ........................ 198/345.2; 29/760, 29/739, 829; 269/8, 56, 289 R, 71

(56) References Cited

U.S. PATENT DOCUMENTS

| | | | |
|---|---|---|---|
| 3,868,764 A | | 3/1975 | Hartleroad et al. |
| 4,399,988 A | | 8/1983 | De Shong |
| 4,704,792 A | | 11/1987 | Itagaki et al. |
| 5,211,324 A | | 5/1993 | Fiedler |
| 5,292,388 A | * | 3/1994 | Candore ...................... 156/64 |
| 5,523,941 A | | 6/1996 | Burton et al. |
| 5,730,051 A | * | 3/1998 | Takahashi et al. .......... 101/126 |
| 5,860,640 A | * | 1/1999 | Marohl et al. .......... 269/289 R |
| 5,984,293 A | * | 11/1999 | Abrahamson et al. ...... 269/266 |
| 6,035,522 A | * | 3/2000 | Larson et al. .................. 29/760 |
| 6,113,693 A | * | 9/2000 | Thompson ................... 118/500 |
| 6,245,189 B1 | * | 6/2001 | Rigali et al. ........... 156/345.54 |
| 6,374,729 B1 | * | 4/2002 | Doyle ......................... 101/114 |

* cited by examiner

*Primary Examiner*—Richard Ridley
(74) *Attorney, Agent, or Firm*—Dinsmore & Shohl LLP

(57) ABSTRACT

A printed circuit board support comprising a support base and a base extension assembly. The support base defines a support surface. The base extension assembly is secured to the support base and is arranged to define a variable extension assembly height dimension and at least a portion of a height dimension of the printed circuit board support, wherein variation of the variable extension assembly height dimension results in variation of the height dimension of the printed circuit board support. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 CFR §1.72(b).

9 Claims, 5 Drawing Sheets

PRINTED CIRCUIT BOARD SUPPORT

CROSS-REFERENCE TO RELATED APPLICATIONS

This application is a division of application Ser. No. 09/704,294 (now U.S. Pat. No. 6,631,798 B1), filed Nov. 1, 2000 and entitled "PRINTED CIRCUIT BOARD SUPPORT", and is further related to co-pending application Ser. Nos. 10/375,807, 10/375,275, and 10/375,818, which were all filed on Feb. 27, 2003 and are all entitled "PRINTED CIRCUIT BOARD SUPPORT".

BACKGROUND OF THE INVENTION

The present invention relates to printed circuit board handling and manufacturing processes and, more particularly, to an improved printed circuit board support, printed circuit board conveying system, and printed circuit board processing system.

Conventional printed circuit board processing systems, e.g., SMT (surface mount technology) manufacturing systems, typically utilize a conveyor system to move a printed circuit board from station to station within the system. Often, the printed circuit board is supported or held in a manner that is insufficient to prevent the board from warping, twisting, or bending during processing. Accordingly, there is a need in the art of printed circuit board handling and processing for an improved printed circuit board support.

BRIEF SUMMARY OF THE INVENTION

This need is met by the present invention wherein an improved printed circuit board support, an improved printed circuit board conveying system, and an improved printed circuit board processing system are provided. In accordance with one embodiment of the present invention, a printed circuit board support is provided comprising a support base, a spacer, and a spacer securement. The support base defines a support surface. The spacer engages the support surface. The spacer securement includes a projection and a recess. The projection adjoins one of the support base and the spacer. The recess is formed in the other of the support base and the spacer. The projection extends into the recess and the projection and the recess are configured such that the extension of the projection into the recess limits movement of the spacer relative to a plane parallel to the support surface.

The printed circuit board support may comprise two or more spacer securements. The projection may comprise a substantially cylindrical pin and the recess may comprise a cylindrical recess having a diameter slightly larger than the pin. The spacer may define an upper spacer surface spaced from and substantially parallel to the support surface.

In accordance with another embodiment of the present invention, a printed circuit board support assembly is provided comprising a support base and a plurality of spacers. The support base defines a support surface and at least one recess formed therein. The recess defines an opening on the support surface. The plurality of spacers define respective upper spacer surfaces and opposite spacer surfaces. The spacers define a range of respective thickness dimensions between respective ones of the spacer surfaces and corresponding ones of the opposite spacer surfaces. Each of the spacers includes at least one projection extending from the opposite spacer surface. The respective projections and the recess formed in the support base are sized to enable extension of the respective projections into the recess and to limit movement of the spacer relative to a plane parallel to the support surface.

In accordance with yet another embodiment of the present invention, a printed circuit board support is provided comprising a support base. The support base defines a support surface, a leading edge, a trailing edge, and a pair of lateral edges. The support base also defines a cut-out formed therein. The cut-out is positioned between the pair of lateral edges and extends from the leading edge in the direction of the trailing edge to a position between the leading edge and the trailing edge.

The leading edge, the trailing edge, and the pair of lateral edges may be defined in a substantially planar surface of the support base. The cut-out may be formed in the support surface of the support base. The printed circuit board support may further comprise a spacer and a spacer securement. The spacer engaging the support surface and including an additional cut out formed therein and the spacer securement arranged to secure the spacer to the support surface with the additional cut-out aligned with the cut-out formed in the support base. The additional cut-out and the cut-out in the support base may be coextensive. The additional cut out may be formed in an upper spacer surface of the spacer.

In accordance with yet another embodiment of the present invention, a printed circuit board support is provided comprising a support base defining a support surface. A base extension assembly is secured to the support base and is arranged to define a variable extension assembly height dimension and at least a portion of a height dimension of the printed circuit board support, wherein variation of the variable extension assembly height dimension results in variation of the height dimension of the printed circuit board support.

The base extension assembly may be further arranged such that the extension assembly height dimension varies in response to a force applied to the support surface. The base extension assembly comprises a spring-loaded extension including a spring arranged to compress in response to a force applied to the support surface. The base extension assembly may comprise a viscously damped extension arranged to compress in response to a force applied to the support surface. The base extension assembly may comprise a pair of support legs. Each of the pair of support legs may be arranged such that the extension assembly height dimension varies in response to a force applied to the support surface.

In accordance with yet another embodiment of the present invention, a printed circuit board support is provided comprising a support base, a base extension, and a magnetic source. The support base defines a support surface and a lower surface. The base extension is secured to the support base and is arranged to define at least a portion of a height dimension of the printed circuit board support. A magnetic source is secured to the base extension and is positioned such that the lower surface of the support base is arranged to secure the printed circuit board support to an object under magnetic force. The magnetic source may comprise a permanent magnet and may be secured within a cavity formed in the lower surface of the support base.

In accordance with yet another embodiment of the present invention, a printed circuit board conveying system is provided comprising a pair of conveyor rails and a printed circuit board support. The pair of conveyor rails are positioned to engage opposite lateral edge portions of a printed circuit board and are configured to convey the printed circuit board along a conveyor path. The printed circuit board support is positioned to support a portion of the printed circuit board between the lateral edge portions. The printed circuit board support comprises a support base defining a support surface, a spacer engaging the support surface, and a spacer securement including a projection and a recess. The projection adjoins one of the support base and the spacer.

The recess is formed in the other of the support base and the spacer. The projection extends into the recess. The projection and the recess are configured such that the extension of the projection into the recess limits movement of the spacer relative to a plane parallel to the support surface. A thickness dimension of the spacer is selected to enable engagement of the spacer with the printed circuit board.

In accordance with yet another embodiment of the present invention, a printed circuit board conveying system is provided comprising a pair of conveyor rails, a printed circuit board support, and a stop mechanism. The pair of conveyor rails are positioned to engage opposite lateral edge portions of a printed circuit board and are configured to convey the printed circuit board along a conveyor path. The printed circuit board support is positioned to support a portion of the printed circuit board between the lateral edge portions and comprises a support base. The support base defines a support surface, a leading edge, a trailing edge, a pair of lateral edges, and a cut-out formed therein. The cut-out is positioned between the pair of lateral edges and extends from the leading edge in the direction of the trailing edge to a position between the leading edge and the trailing edge. The stop mechanism is positioned to engage the printed circuit board support at a point within the cut-out. The stop mechanism may include an actuator and a pin and may be configured to selectively extend and retract the pin to and from a position engaging the printed circuit board support at the point within the cut-out.

In accordance with yet another embodiment of the present invention, a printed circuit board conveying system is provided comprising a pair of conveyor rails and a printed circuit board support. The pair of conveyor rails are positioned to engage opposite lateral edge portions of a printed circuit board and configured to convey the printed circuit board along a conveyor path. The printed circuit board support is positioned to support a portion of the printed circuit board between the lateral edge portions and comprises a support base and a base extension assembly. The support base defines a support surface. The base extension assembly is secured to the support base and is arranged to define a variable extension assembly height dimension and at least a portion of a height dimension of the printed circuit board support. Variation of the variable extension assembly height dimension results in variation of the height dimension of the printed circuit board support. The base extension assembly is configured such that the height dimension of the printed circuit board support permits engagement of the support surface with the printed circuit board.

In accordance with yet another embodiment of the present invention, a printed circuit board conveying system is provided comprising a pair of conveyor rails, a conveyor platform, and a printed circuit board support. The pair of conveyor rails are positioned to engage opposite lateral edge portions of a printed circuit board and are configured to convey the printed circuit board along a conveyor path. The printed circuit board support is positioned to support a portion of the printed circuit board between the lateral edge portions. The printed circuit board support comprises a magnetic source secured to the base extension assembly and positioned such that the lower surface of the support base secures the printed circuit board support to the conveyor platform under magnetic force, wherein the base extension assembly is configured such that the height dimension of the printed circuit board support permits engagement of the support surface with the printed circuit board.

In accordance with yet another embodiment of the present invention, a printed circuit board processing system is provided. The system includes a printed circuit board conveying system coupling a printed circuit board loader to a stencil printer, a pick and place machine, and a reflow oven. The printed circuit board conveying system comprises a pair of conveyor rails and a printed circuit board support according to the present invention.

In accordance with yet another embodiment of the present invention, a method of conveying a printed circuit board in a printed circuit board conveying system is provided. The conveying system is provided in accordance with the present invention and the conveying method comprises the steps of selecting one of the plurality of spacers as a function of its thickness and a thickness profile of the printed circuit board engaged by the pair of conveyor rails; installing the selected spacer by extending at least one of the respective projections into the recess; and engaging an upper spacer surface of the selected spacer with the printed circuit board.

In accordance with yet another embodiment of the present invention, a method of conveying a printed circuit board in a printed circuit board conveying system is provided. The conveying system is provided in accordance with the present invention and the conveying method comprises the steps of engaging the support surface of the support base with the printed circuit board engaged by the pair of conveyor rails and varying the height dimension of the base extension assembly as a function of a thickness profile of the printed circuit board.

In accordance with yet another embodiment of the present invention, a method of processing a printed circuit board in a processing system including a printed circuit board conveying system coupling a printed circuit board loader to a stencil printer, a pick and place machine, and a reflow oven is provided. The printed circuit board conveying system is provided in accordance with the present invention and the processing method comprises the steps of selecting one of the plurality of spacers as a function of its thickness and a thickness profile of the printed circuit board engaged by the pair of conveyor rails, installing the selected spacer by extending at least one of the respective projections into the recess, and engaging an upper spacer surface of the selected spacer with the printed circuit board within the operating envelope of the pick and place machine.

In accordance with yet another embodiment of the present invention, a method of processing a printed circuit board in a processing system including a printed circuit board conveying system coupling a printed circuit board loader to a stencil printer, a pick and place machine, and a reflow oven is provided. The printed circuit board conveying system is provided in accordance with the present invention and the processing method comprises the steps of engaging the support surface of the support base with the printed circuit board engaged by the pair of conveyor rails within the operating envelope of the pick and place machine and varying the height dimension of the base extension assembly as a function of a thickness profile of the printed circuit board.

Accordingly, it is an object of the present invention to provide an improved printed circuit board support, an improved printed circuit board conveying system, and an improved printed circuit board processing system. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
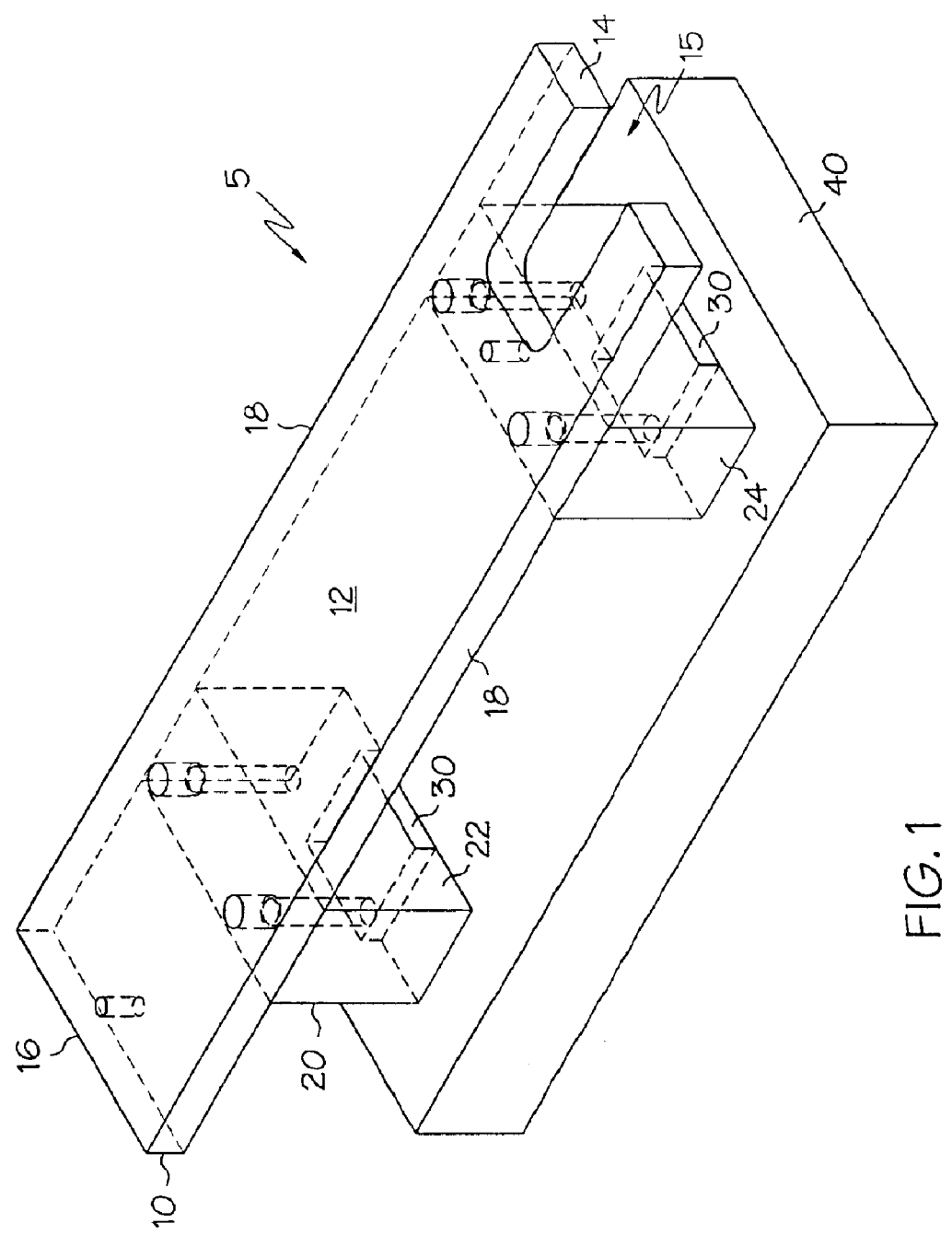
FIG. 1 is an illustration of a printed circuit board support according to one embodiment of the present invention.

Referring now to FIGS. 1–5 a printed circuit board support 5, printed circuit board conveying system 60, and a printed circuit board processing system 70 according to the present invention are illustrated. The printed circuit board support 5 illustrated in FIG. 1 comprises a support base 10 defining a support surface 12. A base extension assembly 20 is secured to the support base 10. The base extension assembly 20 may be secured to the support base 10 by forming the extension assembly 20 and the support base 10 as a single integral piece or by coupling two separate pieces mechanically, adhesively, magnetically, or otherwise.

The support base 10 defines a leading edge 14, a trailing edge 16, and a pair of lateral edges 18. As is illustrated in FIG. 1, the leading edge 14, the trailing edge 16, and the pair of lateral edges 18 are defined in a substantially planar support surface 12 of the support base 10. In the illustrated embodiment, the base extension assembly 20 comprises a pair of support legs 22, 24.

According to one embodiment of the present invention, a cut-out 15 is formed in the support base 10. The cut-out 15 is positioned between the pair of lateral edges 18 and extends from the leading edge 14 in the direction of the trailing edge 16 to a position between the leading edge 14 and the trailing edge 16. In the illustrated embodiment, the cut-out 15 is formed in the support surface 12 of the support base 10. The purpose of the cut-out 15 is illustrated in further detail herein with reference to the function of the conveying and processing systems of the present invention.

Figure 2:
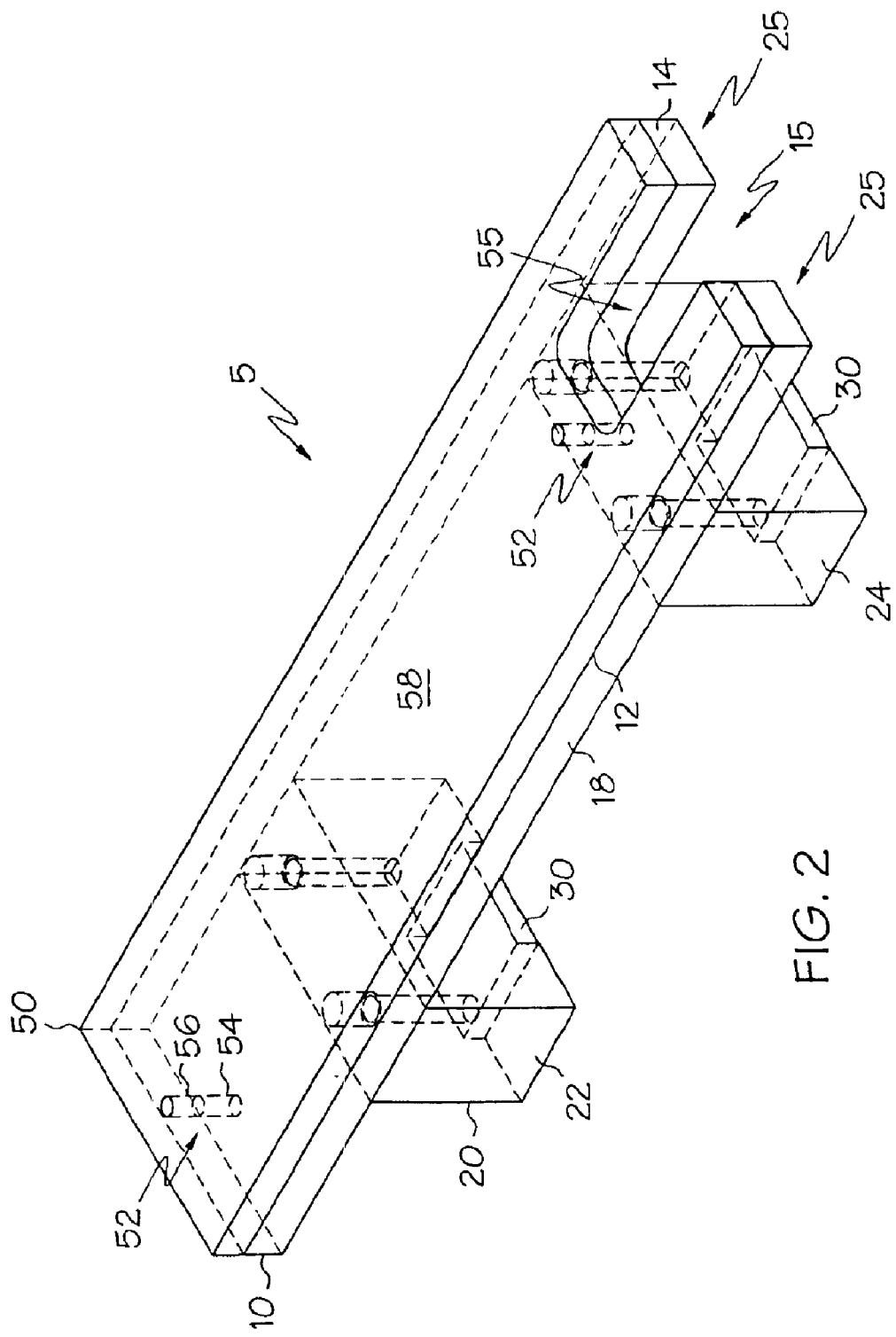
FIG. 2 is an illustration of a printed circuit board support according to another embodiment of the present invention.

Referring specifically to FIGS. 1 and 2, the printed circuit board support 5 may further comprise a pair of permanent magnets 30 secured within respective cavities in each of the support legs 22, 24 of the base extension 20. The magnets 30 are positioned such that the lower surface of the support base 10 is arranged to secure the printed circuit board support 5 to a conveyor platform or other object 40 under magnetic force. Alternative magnetic sources 30, e.g., electromagnets, may be provided without departing from the scope of the present invention.

Figure 3A:
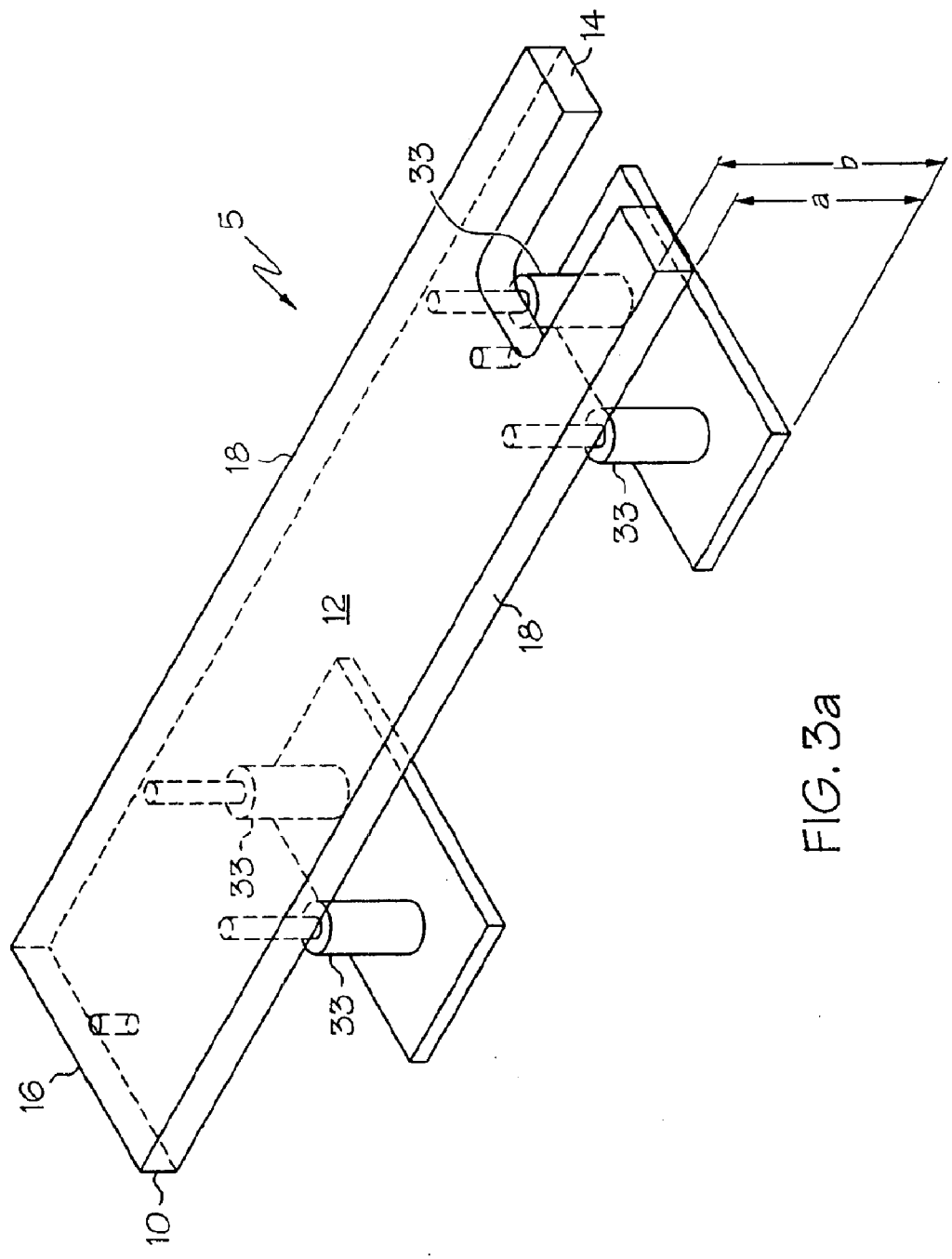
FIG. 3a is an illustration of a printed circuit board support according to yet another embodiment of the present invention.
Figure 3B:
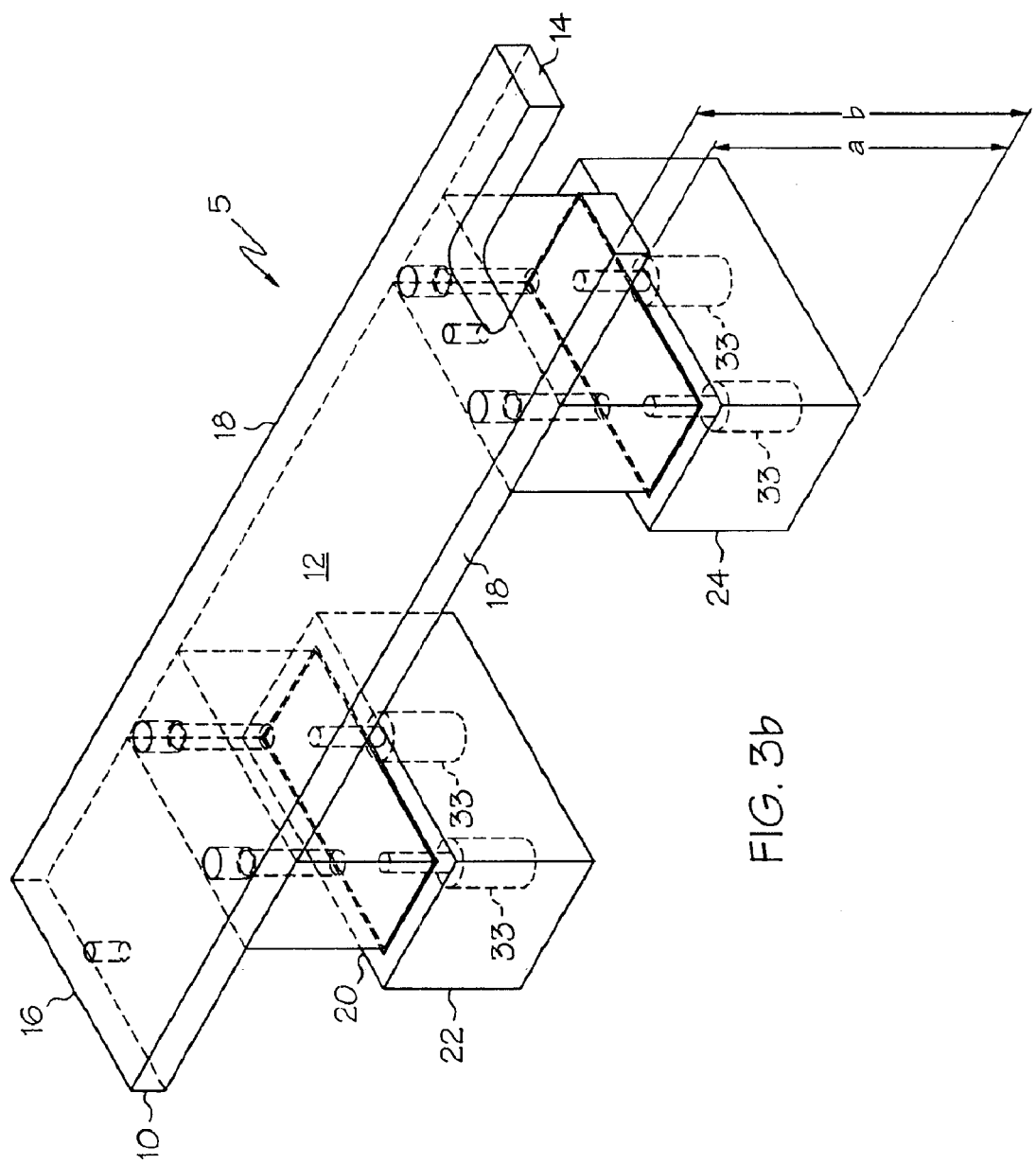
FIG. 3b is an illustration of a printed circuit board support according to still another embodiment of the present invention.

The base extension assembly 20 may comprise a single molded piece with or without attachments or, as is illustrated in FIG. 3b, may comprise a compound assembly arranged to define a variable height dimension a of the extension assembly 20 and at least a portion of a height dimension b of the printed circuit board support 5. As will be appreciated by those practicing the present invention, variation of the variable extension assembly height dimension a results in variation of the height dimension b of the printed circuit board support 5.

The extension assembly 20 may comprise a spring arranged to compress in response to a force applied to the support surface 12, a viscously damped extension 33 arranged to compress in response to a force applied to the support surface 12 (see FIGS. 3a and 3b), or any other components arranged to enable variation of the height dimension a of the extension assembly 20. The variation of the height dimension a may be in response to a force applied to the support surface 12 or may be a result of selective control of the height dimension a independent of the force applied to the support surface 12. In the illustrated embodiment, each of the pair of support legs 22, 24 are arranged, in the manner described herein, such that the extension assembly height dimension is variable.

Referring further to FIG. 2, an additional embodiment of the present invention is illustrated. A spacer 50 is provided in engagement with the support surface 12. A spacer securement 52 includes a recess 54 in the form of a cylindrical bore and a projection 56 in the form of a pin. In the illustrated embodiment, the pin 56 is mounted to or formed integrally with the spacer 50 and the recess 54 is formed in the support base 10. It is contemplated, however, that the pin 56 may be mounted to the support base 10 and the recess 54 may be formed in the spacer 50.

In the engaged state, the projection 56 extends into the recess 54 and the projection 56 and the recess 54 are configured such that the extension of the projection 56 into the recess 54 limits movement of the spacer 50 relative to a plane parallel to the support surface 12. As is illustrated in FIG. 2, the printed circuit board support 5 may comprise at least two spacer securements 52.

The spacer 50 functions to provide an upper spacer surface 58 spaced from and substantially parallel to the support surface 12. As clearly illustrated in FIGS. 2 and 4, the upper spacer surface 58 is sized and configured to support and engage a major portion of a printed circuit board 80. Most preferably a plurality of spacers of different thicknesses are made available for engagement with the support base 10. In this manner, the printed circuit board support 5 may be configured to support a variety of printed circuit boards of varying thickness profiles.

In the embodiment illustrated in FIG. 2, the spacer 50 engaging the support surface 12 includes an additional cut out 55 formed therein. The spacer securements 52 are arranged to secure the spacer 50 to the support surface 12 with the additional cut-out 55 aligned with the cut-out 15 formed in the support base 10. Typically, the additional cut-out 55 and the cut-out 15 in the support base 10 are coextensive, i.e., they have substantially the same spatial scope or boundaries. Moreover, as clearly illustrated in FIGS. 1–3b, the cut-out 15 transects the thickness of the support base 10 and, as clearly illustrated in FIG. 2, the additional cut-out 55 transects the thickness of the spacer 50. The additional cut out 55 is formed in an upper spacer surface 58 of the spacer 50. The upper surface 58 of the spacer 50 and the support surface 12 collectively define a pair of supportive extensions 25 which provide additional support for printed circuit boards that extend across the cut-out 15 and the additional cut-out 55.

Figure 4:
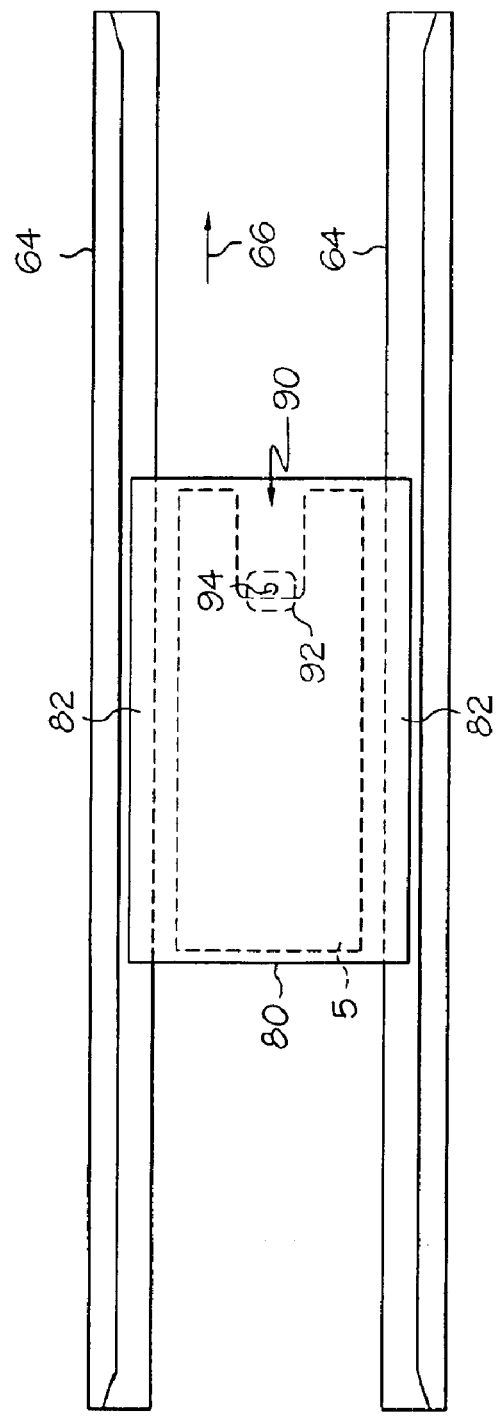
FIG. 4 is an illustration of a printed circuit board conveying system according to the present invention.
Figure 5:
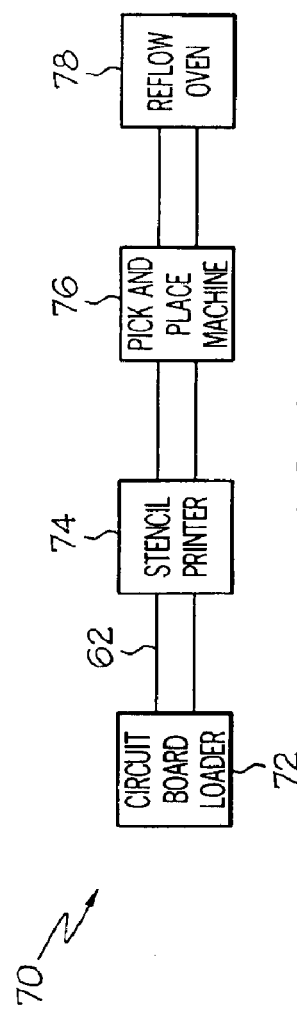
FIG. 5 is an illustration of a printed circuit board processing system.

Referring now to FIGS. 4 and 5, a printed circuit board conveying system, a printed circuit board processing system, and their manners of operation are described. A printed circuit board conveying system 60 is incorporated within the processing system 70 and includes a conveyor 62 coupling a printed circuit board loader 72 to a stencil printer 74, a pick and place machine 76, and a reflow oven 78. The printed circuit board conveying system 60 comprises a pair of conveyor rails 64 positioned to engage opposite lateral edge portions 82 of a printed circuit board 80 and is configured to convey the printed circuit board 80 along a conveyor path, as indicated by directional arrow 66. A printed circuit board support 5 according to the present invention is positioned to support a major portion of the printed circuit board 80 between the lateral edge portions 82 within an operating envelope of the pick and place machine 76. It is contemplated by the present invention that the printed circuit board support 5 may be positioned to support a major portion of the printed circuit board 80 within the respective operating envelopes of other components of the processing system 70 as well.

A stop mechanism 90 is illustrated in FIG. 4, and includes an actuator 92 and a pin 94. The stop mechanism 90 is configured to selectively extend and retract the pin 94 to and from a position engaging the printed circuit board support 5 at a point within the cut-out 15. In this manner, the stop mechanism 90 may be utilized to control the movement of selected printed circuit board supports 5 along the conveyor path.

In operation, one of a plurality of spacers 50 (See FIG. 2) having different thicknesses is selected depending upon the thickness profile of the printed circuit board 80 engaged by the pair of conveyor rails 64. More specifically, the spacer 50 having a thickness most suitable for optimum supportive engagement of the printed circuit board 80 by the printed circuit board support 5 is selected. The selected spacer 50 is installed by extending or positioning the respective projections 56 into the corresponding recesses 54. The upper spacer surface 58 of the selected spacer 50 is then utilized to engage the printed circuit board 80 within the operating envelope of the pick and place machine 76. Alternatively, the spacer 50 may be eliminated and the base extension assembly 20 may be arranged to define a variable extension assembly height dimension a, as discussed herein with reference to FIGS. 3a and 3b, and the height dimension of the base extension assembly 20 may be varied as a function of a thickness profile of the printed circuit board 80. In which case the upper surface 12 will engage the printed circuit board 80. It is contemplated that the variable height base extension assembly 20 and the spacers 50 may be utilized in a cooperative relationship in a single embodiment of the present invention.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A printed circuit board support comprising:
a support base defining a support surface; and
a base extension assembly secured to said support base and arranged to define a variable extension assembly height dimension and at least a portion of a height dimension of said printed circuit board support, wherein
said base extension assembly comprises a viscously damped extension arranged to compress in response to a force applied to said support surface, and
variation of said variable extension assembly height dimension results in variation of said height dimension of said printed circuit board support.

2. A printed circuit board support as claimed in claim 1 wherein said base extension assembly is further arranged such that said extension assembly height dimension varies in response to a force applied to said support surface.

3. A printed circuit board support as claimed in claim 1 wherein said viscously damped extension further comprises a spring arranged to compress in response to a force applied to said support surface.

4. A printed circuit board support as claimed in claim 1 wherein said base extension assembly comprises a pair of support legs.

5. A printed circuit board support as claimed in claim 4 wherein each of said pair of support legs are arranged such that said extension assembly height dimension varies in response to a force applied to said support surface.

6. A printed circuit board support as claimed in claim 4 wherein each of said support legs comprises said viscously damped extension arranged to compress in response to a force applied to said support surface.

7. A printed circuit board support as claimed in claim 6 wherein said viscously damped extension further comprises a spring arranged to compress in response to a force applied to said support surface.

8. A printed circuit board conveying system comprising:
a pair of conveyor rails positioned to engage opposite lateral edge portions of a printed circuit board and configured to convey said printed circuit board along a conveyor path; and
a printed circuit board support positioned to support a major portion of said printed circuit board between said lateral edge portions, said printed circuit board support comprising
a support base defining a support surface; and
a base extension assembly secured to said support base and arranged to define a variable extension assembly height dimension and at least a portion of a height dimension of said printed circuit board support, wherein
said base extension assembly comprises a viscously damped extension arranged to compress in response to a force applied to said support surface, and
variation of said variable extension assembly height dimension results in variation of said height dimension of said printed circuit board support, and wherein said base extension assembly is configured such that said height dimension of said printed circuit board support permits engagement of said support surface with said printed circuit board.

9. A printed circuit board processing system including a printed circuit board conveying system coupling a printed circuit board loader to a stencil printer, a pick and place machine, and a reflow oven, wherein said printed circuit board conveying system comprises:
a pair of conveyor rails positioned to engage opposite lateral edge portions of a printed circuit board and configured to convey said printed circuit board along a conveyor path; and
a printed circuit board support positioned to support a major portion of said printed circuit board between said lateral edge portions within an operating envelope of said pick and place machine, said printed circuit board support comprising
a support base defining a support surface; and
a base extension assembly secured to said support base and arranged to define a variable extension assembly height dimension and at least a portion of a height dimension of said printed circuit board support, wherein
said base extension assembly comprises a viscously damped extension arranged to compress in response to a force applied to said support surface, and
variation of said variable extension assembly height dimension results in variation of said height dimension of said printed circuit board support, and wherein said base extension assembly is configured such that said height dimension of said printed circuit board support permits engagement of said support surface with said printed circuit board.

* * * * *